United States Patent [19]

D'Angelo et al.

[11] Patent Number: 4,810,530

[45] Date of Patent: Mar. 7, 1989

[54] METHOD OF COATING METAL CARBIDE NITRIDE, AND CARBONITRIDE WHISKERS WITH METAL CARBIDES, NITRIDES, CARBONITRIDES, OR OXIDES

[75] Inventors: Charles D'Angelo, Southboro; Joseph G. Baldoni, II, Norfolk; Sergej-Tomislav Buljan, Acton, all of Mass.

[73] Assignee: GTE Laboratories Incorporated, Waltham, Mass.

[21] Appl. No.: 899,835

[22] Filed: Aug. 25, 1986

[51] Int. Cl.$^4$ .................... B05D 7/00; C23C 16/32
[52] U.S. Cl. .................... 427/215; 427/249; 427/255; 427/255.2; 427/255.3; 427/255.7; 427/419.2; 427/419.7
[58] Field of Search .............. 427/249, 255.2, 255.3, 427/255, 419.2, 419.7, 255.7, 215

[56] References Cited

U.S. PATENT DOCUMENTS

| | | | |
|---|---|---|---|
| 3,244,480 | 4/1966 | Johnson et al. | 23/191 |
| 3,403,008 | 9/1968 | Hamling | 23/344 |
| 3,437,443 | 4/1969 | Hertl | 23/202 |
| 3,582,271 | 6/1971 | Minagawa et al. | 23/142 |
| 3,752,655 | 8/1973 | Ramgvist | 29/182.5 |
| 4,035,541 | 7/1977 | Smith et al. | 427/249 |
| 4,122,338 | 7/1979 | Schintlmeister | 427/249 |
| 4,180,400 | 12/1979 | Smith et al. | 427/255.2 |
| 4,196,233 | 4/1980 | Bitzer et al. | 427/255.2 |
| 4,214,037 | 7/1980 | Galasso et al. | 428/367 |
| 4,237,184 | 12/1980 | Gonseth et al. | 427/249 |
| 4,269,899 | 5/1981 | Fuyama et al. | 427/249 |
| 4,282,289 | 8/1981 | Kullander et al. | 427/249 |
| 4,341,834 | 7/1982 | Kikuchi et al. | 427/249 |
| 4,399,168 | 8/1983 | Kullander et al. | 427/249 |
| 4,442,169 | 4/1984 | Graham | 427/249 |
| 4,463,033 | 7/1984 | Kikuchi et al. | 427/255.2 |
| 4,463,062 | 7/1984 | Hale | 427/249 |
| 4,497,874 | 2/1985 | Hale | 427/249 |
| 4,500,504 | 2/1985 | Yamamoto | 423/345 |
| 4,521,393 | 6/1985 | Saito et al. | 423/344 |
| 4,525,335 | 6/1985 | Tanaka et al. | 423/344 |
| 4,552,740 | 11/1985 | Morgan et al. | 423/344 |
| 4,569,886 | 2/1986 | Divecha et al. | 428/379 |
| 4,579,699 | 4/1986 | Verzemnieks | 264/043 |
| 4,604,273 | 8/1986 | Czupryna et al. | 423/344 |

OTHER PUBLICATIONS

Akio Kato et al., *J. Crystal Growth*, 37, pp. 293–300 (1977).
Akio Kato et al., *J. Crystal Growth*, 49, pp. 199–203 (1980).
Keiji Naito, *J. Crystal Growth*, 45, pp. 506–510 (1978).
H. Altena et al., Euro CVD Four, Proc. Eur. Conf. Chem. Vap. Deposition, 4th J. Bloem, Ed., pp. 428–434 (1983).
M. Futamoto et al., *J. Crystal Growth*, 61, pp. 69–74 (1983).
Kenji Hamamura et al. *J. Crystal Growth*, 26, pp. 255–260 (1974).
Takehiko Takahashi et al., *J. Electrochem. Soc.*, 117, pp. 541–545 (1970).
Nobuyuki Tamari et al., *J. Less-Common Metals*, 58, pp. 147–160 (1978).
Nobuyuki Tamari et al., *J. Crystal Growth*, 46, pp. 221–237, (1979).
Wokulski et al, *J. Crystal Growth*, 62, pp. 439–446 (1983).
Wokulski et al., *Conf. Appl. Crystallogr.*, 11, pp. 258–263 (1984).

*Primary Examiner*—Sadie Childs
*Attorney, Agent, or Firm*—Frances P. Craig

[57] ABSTRACT

A method for coating single crystal whiskers of carbides, nitrides or carbonitrides of Ti, Zr, Hf, V, Nb, Ta, or W with one or more layers of a carbide, nitride or carbonitride of Ti, Zr, Hf, Nb, Ta, or W, or oxides of Al, Zr, or Hf. The method involves flowing past the whiskers at about 1025°–1125° C. a mixture of hydrogen and one of the following gaseous mixtures: Group I comprises one or more of Ti, Zr, Hf, Nb, Ta, or W hhalides mixed with one or more of $N_2$, $NH_3$, or suitable free carbon forming aliphatic hydrocarbons. The atomic ratio of carbon and/or nitrogen to metal is about 5:1–16:1, and the volume ratio of hydrocarbon and/or $N_2$ and/or $NH_3$ to $H_2$ is about 1:5 to 1:20. Group II comprises one or more Al, Zr, or Hf halides mixed with one or more suitable oxygen donor gases, in proportions selected to form the desired metal oxide.

6 Claims, No Drawings

METHOD OF COATING METAL CARBIDE NITRIDE, AND CARBONITRIDE WHISKERS WITH METAL CARBIDES, NITRIDES, CARBONITRIDES, OR OXIDES

CROSS-REFERENCE TO RELATED APPLICATIONS

This application contains subject matter related to matter disclosed in copending U.S. patent application Ser. Nos. 899,834 and 899,833, now U.S. Pat. No. 4,756,791 both filed concurrently with the present application and both assigned to the same Assignee as the present application. Application Ser. Nos. 899,834 and 899,833 are incorporated herein by reference.

FIELD OF THE INVENTION

This invention relates to a process for producing coated single crystal metal carbide, nitride, or carbonitride whiskers, particularly for coating metal carbide, nitride, or carbonitride whiskers by a chemical vapor deposition process, and to the coated whiskers produced thereby.

BACKGROUND OF THE INVENTION

In recent years there has been an increasing need for composite materials having high fracture toughness, hardness and wear resistance for use in cutting tools, wear parts, and structural applications such as dies, turbines, nozzles, and the like. Due to their high modulus of elasticity, high hardness, high strength, and resistance to chemical reaction with the composite matrix, coated single crystal whiskers of such materials as carbides, nitrides, or carbonitrides of Ti, Zr, Hf, V, Nb, Ta or W could present attractive materials for composite technology. Whiskers of metal carbides or nitrides, for example, titanium carbide, are known. Laboratory methods for their production involve placing a substrate material suitable for whisker growth, for example a graphite or mullite plate or tube, at the center of a quartz tube, and heating the substrate to a temperature suitable for whisker growth. Typical temperatures in such reactors range from about 800°–1400° C. The reactor tube is flushed with hydrogen, and reactant gases, typically in a molar ratio of carbon or nitrogen to metal of about 1:1, are flowed through the heated reactor to form whiskers on the substrate.

Ceramic whiskers coated with MgO are disclosed in U.S. Pat. No. 4,569,886 to Divecha et al. Carbon fibers coated with $Si_3N_4$ are disclosed in U.S. Pat. No. 4,214,037 to Galasso et al. However, neither patent discloses the coated metal carbide, nitride, or carbonitride whiskers, or the processes for their production, of the present invention.

SUMMARY OF THE INVENTION

The present invention provides an efficient process for producing coated metal carbide, nitride, or carbonitride whiskers of controlled dimensions, morphology, and quality, and the whiskers produced thereby.

The whisker according to the invention is a single crystal whisker of a carbide, nitride, or carbonitride of one or more of the metals Ti, Zr, Hf, V, Nb, Ta, or W. The whisker has an aspect ratio of length to diameter of about 5:1 to 500:1, and a diameter of about 0.5–10 microns. The whisker is coated with one or more adherent layers independently selected from the carbides, nitrides, and carbonitrides of Ti, Zr, Hf, Nb, Ta, and W, and oxides of Al, Zr, and Hf, or a mixture or solid solution thereof. At least the innermost layer is of a different composition than the whisker, and the total thickness of the coating is between a monomolecular layer and about one-half the diameter of the whisker.

A process according to the invention for producing the coated whiskers involves flowing past the metal carbide, nitride, or carbonitride whiskers described above, in a reaction chamber heated to an operating temperature of about 1025°–1125° C., sealed from the ambient atmosphere, and essentially free from undesired contaminants, a mixture of gaseous reactants comprising hydrogen and one of the following groups of gases: Group I comprises a mixture of one or more metal halide gases selected from the halides of Ti, Zr, Hf, Nb, Ta, and W, and one or more gases selected from nitrogen, ammonia, and aliphatic hydrocarbons pyrolyzable at the operating temperature to form free carbon. The atomic ratio of carbon plus nitrogen to metal is about 5:1 to 16:1, and the volume ratio of hydrocarbon, plus nitrogen, plus ammonia to hydrogen is about 1:5 to 1:20. Group II comprises a mixture of one or more halides of Al, Zr, and Hf, and one or more oxygen donor gases reacting with the metal at the operating temperature to form the desired metal oxide, and in proportions selected to react to form the desired metal oxide. The flow of the mixture of reactant gases is maintained at a suitable linear velocity for a time sufficient to deposit the coating described above on the whiskers. More than one layer may be deposited on the whiskers by repeating the process using different reactants to deposit each layer.

Another embodiment of the process according to the invention involves the additional step of producing the whiskers to be coated by first flushing the sealed reaction chamber with flowing hydrogen gas. The reaction chamber includes one or more substrate surfaces formed from one or more substrate materials suitable for providing catalyzing and supporting substrates for nucleation and growth of the whiskers. The substrate surfaces are maintained at the operating temperature of about 1025°–1125° C. The hydrogen flowing through the reaction chamber is then mixed, at about ambient pressure, with reactants comprising one or more metal halide gases, where the metal is one or more of Ti, Zr, Hf, V, Nb, Ta, and W, and one or more gases selected from nitrogen, ammonia, and aliphatic hydrocarbon gases pyrolyzable at the operating temperature to form free carbon. The atomic ratio of carbon plus nitrogen to metal in the incoming gases is about 5:1 to 16:1, and the volume ratio of hydrocarbon, plus nitrogen gas, plus ammonia to hydrogen is about 1:5 to 1:20. The flowing mixture of gases is maintained at a suitable linear velocity for a time sufficient to nucleate and grow the metal carbide, nitride, or carbonitride whiskers on the substrate material surfaces.

The most preferred embodiment according to the invention provides a process for the controlled production in commercial quantities of the coated single crystal metal carbide, nitride, or carbonitride whiskers according to the invention. The process involves the additional step of producing the whiskers to be coated by flushing the reaction chamber sealed from the ambient atmosphere with flowing hydrogen gas, the reaction chamber being defined by surfaces of which at least a major portion of the surface area is formed from one or more substrate materials suitable for providing catalyzing and supporting substrates for nucleation and growth of the whiskers. The substrate material surfaces are maintained at the operating temperature of about 1025°–1125° C. The hydrogen flowing through the reaction chamber is then mixed, at about ambient pressure, with reactants comprising one or more metal halide gases, where the metal is one or more of Ti, Zr, Hf, V, Nb, Ta, and W, and one or more gases selected from the group consisting of nitrogen, ammonia, and aliphatic hydrocarbon gases pyrolyzable at the operating temperature to form free carbon. The atomic ratio of carbon plus nitrogen to metal in the incoming gases is about 5:1 to 16:1, and the volume ratio of hydrocarbon, plus ammonia, plus nitrogen gas to hydrogen is about 1:5 to 1:20. The flowing mixture of gases is maintained at a suitable linear velocity for a time sufficient to nucleate and grow the metal carbide, nitride, or carbonitride whiskers on the substrate material surfaces.

DETAILED DESCRIPTION OF THE PREFERRED EMBODIMENTS

Details relating to the whisker and the process of this invention, as well as the advantages derived therefrom, will be more fully appreciated by referring to the Detailed Description of the Preferred Embodiments taken in connection with the appended claims.

Throughout the following description, the term metal is used to refer to the transition metals described above, i.e. Ti, Zr, Hf, Nb, Ta, and W for the whiskers and coatings, and additionally V for the whiskers and Al for the oxide coatings.

An illustrative process according to the invention involves producing metal carbide whiskers coated with a metal nitride layer on a nickel doped graphite substrate surface, in the reaction chamber of a vessel sealed from the ambient atmosphere. The substrate surface is heated to an operating temperature of about 1025°–1125° C., preferably 1075°–1100° C., while being flushed with an inert gas. The reaction chamber is then flushed with hydrogen gas, flowing at about ambient pressure.

Following the flushing of the reactor with hydrogen, a suitable pyrolyzable hydrocarbon as described above, for example methane, is introduced to the hydrogen stream and allowed to flow through the reaction chamber with the addition of a suitable metal halide gas as described above, in an amount suitable for whisker growth. The pressure within the reaction chamber preferably is maintained at about 1 atmosphere throughout the operation of the reactor, although operation at about 1–2 atmospheres is possible.

The atomic ratio of carbon to metal in the reactant gases is maintained at about 5:1 to 16:1, preferably 8:1 to 12:1, and the volume ratio of hydrocarbon to hydrogen at about 1:5 to 1:20. The flow of reactant gases is maintained, preferably at a linear velocity of about 120–140 cm/sec, for a time sufficient for metal carbide whisker nucleation and growth, normally about 1–6 hrs. Following the whisker growth, the flows of reactant gases are stopped, and the flow of hydrogen gas is maintained to flush the reaction chamber of reactants. Nitrogen is then mixed with the hydrogen and allowed to come to equilibrium. Finally the flow of the same or a different metal halide is added to the flow of gases. The atomic ratio of nitrogen to metal in the gas flow is maintained at about 5:1 to 16:1, preferably 8:1–12:1, and the volume ratio of nitrogen to hydrogen at about 1:5 to 1:20. The gas flow is maintained, preferably at a linear velocity of about 120–140 cm/sec, for a time sufficient to coat the metal carbide whiskers with a layer of metal nitride of a thickness between a monomolecular layer to about one-half the whisker diameter. Normally less than 1 hr is sufficient for a nitride coating. Following the coating of the whiskers, the flow of reactant gases are stopped, and the flow of hydrogen gas is maintained, while the substrate surface is cooled to ambient temperature. Finally, the reaction chamber is flushed with an inert gas such as argon and the reactor is opened for removal of the coated whiskers.

In a similar illustrative process according to the invention, metal nitride whiskers coated with $Al_2O_3$ are produced in the reactor described above with respect to the metal carbide whiskers. The process is the same as that for producing the nitride coated metal carbide whiskers with the exception that the hydrocarbon for whisker growth is replaced by an equivalent amount of nitrogen gas or ammonia in the reactant gases, while the nitrogen and metal halide in the coating reactant gas flow are replaced by an equivalent amount of $CO_2$ and an aluminum halide.

Similarly, metal carbonitride whiskers may be grown, or coating layers deposited, by including both the hydrocarbon and nitrogen gas or ammonia in the reactant gases. More than one layer may be deposited by repeating the above-described process using different reactant gas mixtures for each layer. Flushing of the reactor between depositions, including whisker growth is optional.

Alternatively, the coating step of the process described above may be adapted to coat commercially available whiskers, or the whisker production and whisker coating steps may be carried out at separate times, in separate reactors, or in separate portions of the same reactor, by providing a fluidized bed arrangement to keep the whiskers suspended and to prevent bonding of adjacent whiskers by the coating deposited thereon.

In the most preferred process according to the invention, a major portion (greater than 50%) of the surface area of the outer walls and inner fixtures of the reaction chamber is formed from, or lined, coated or plated with one or more materials suitable for substrate surfaces. These surfaces are heated to the operating temperature during operation so that large areas of suitable substrate material or materials are available for whisker growth and subsequent coating as described in above-referenced application Ser. No. 899,833.

The process follows the same whisker growth and coating steps described above with respect to whisker growth and coating on a substrate surface inserted into a reactor. However, during the whisker growth step, the reactant gases flow past and contact a surface area of heated substrate material surfaces many times greater than that described above. Thus, all or a major portion of the surfaces facing or defining the reaction chamber are used for growth and subsequent coating of the whiskers, making possible the production of commercial quantities of high quality coated metal carbide, nitride, or carbonitride whiskers of controlled growth and morphological characteristics.

The following Example is provided to enable one skilled in the art to better understand and practice the process according to the invention. The Example is intended to be merely illustrative, and are not to be viewed as limiting the scope of the invention as defined by the appended claims.

EXAMPLE 1

Growth of Titanium Carbide Whiskers

Whisker growth was carried out at about 1 atm pressure in a sealed reactor as described above and formed of a high nickel alloy coated with a 20-30 micron thick layer of TiC. The reactor was heated while being flushed with argon at 10 standard liters/min. The system was then flushed with hydrogen at 15 liters/min for about 15 min. Methane flowing at 0.6 liters/min was mixed with the hydrogen and allowed to flow for about 5 min, to pyrolyze and coat the substrate surface with a thin layer of free carbon. $TiCl_4$ gas flowing at a rate of 75 cc/min, measured at 35° C., was then mixed with the hydrogen-methane mixture for whisker growth, for a total deposition time of 1 hr.

Deposition of a Titanium Nitride Coating on the Whiskers

After the whisker growth period, the flows of methane and $TiCl_4$ were shut off, and the hydrogen was allowed to flow at 15 liter/min briefly to flush the reactants from the chamber. Nitrogen was mixed with the hydrogen flow at 0.5 standard liters/min and allowed to come to equilibrium. Then 100 cc/min, measured at 35° C., of $TiCl_4$ was added to the gas flow for 1 hr to deposit a layer of TiN on the whiskers. The flows of methane and $TiCl_4$ were then shut off, and the hydrogen was allowed to flow at 15 liters/min until the reactor cooled to ambient temperature. Finally, the system was flushed with argon at 10 liters/min for about 5 min before the reactor was opened to remove the coated whiskers.

The shape and morphology of the coated whiskers of Example 1, grown using the process according to the invention, were observed using optical and scanning electron microscopy. Each whisker was found to be uniform in diameter, straight, smooth surfaced, and free of distortion. The whiskers were 4-5 microns in diameter, and had an aspect ratio of length to diameter of about 100:1. Electron diffraction showed the whiskers to be single crystal, while back-scatter electron channeling (transmission electron microscope) revealed three different growth axes, which are commonly found in titanium carbide whiskers, i.e. [100], [110], [111]. Phase identification by X-ray diffraction shows two separate phases, i.e. a principal phase of titanium carbide and a strong secondary phase of titanium nitride. Total carbon and free carbon content were determined by conductometric analysis, and were found to be close to theoretical value. This is an important finding, since stoichiometry of whisker material determines to some extent the ductility and toughness. The impurities and their distribution in the whiskers were observed by emission spectroscopy and x-ray microanalysis. The total impurity content was found to be less than 1%. The TiN coating was observed to be a thin polycrystalline coating 0.5-1 micron thick, showing a transition zone of Ti(C,N) at the TiC whisker/TiN coating interface. Microhardness was measured at room temperature by Knoop microhardness indentor and found to be 3300 $KG/mm^2 \pm 300$ $KG/mm^2$. Under the processing parameters tested, the whiskers are uniform in diameter, and have highly reflective surfaces without pits or other observable defects, enhancing strength and usefulness in composites.

Although the above Example deals with the growth of TiN coated TiC whiskers, at specific temperatures and for specific growth periods, on coated and carburized high nickel alloy surfaces, using titanium tetrachloride and methane as reactants, the invention is not limited to the specific Example. For example, the metal halide reactant gases may include halides of titanium, zirconium, hafnium, niobium, tantalum, or tungsten, and, for the growth of the whisker, vanadium. Other reactant gases for coating with oxides of aluminum, zirconium, or hafnium, may include Al, Zr, or Hf halides, and oxygen donors such as CO or $CO_2$ for the oxide producing reaction, as described above. Also, a mixture of metal halides may be used to produce whiskers or coatings comprising a solid solution of metal carbides, nitrides, or carbonitrides or coatings of solid solutions of these materials and/or the oxides of Al, Zr, and/or Hf. The hydrocarbon gases preferred for carburizing the reactor surfaces and as reactants for carbide whisker growth or coating deposition include hydrocarbon compounds of the formulas $C_nH_{2n+2}$, $C_nH_{2n}$, or $C_nH_{2n-2}$, where n is a positive integer of 1-4. The most preferred hydrocarbons are methane, propane, and acetylene. Nitrogen gas and/or ammonia may be substituted for or mixed with the hydrocarbon gas to produce nitride or carbonitride whiskers or coatings.

The present invention provides an efficient and commercially useful method of producing high quality, coated single crystal metal carbide, nitride, or carbonitride whiskers useful for composite technology. For example, whiskers produced by the method described above and recited in the appended claims, incorporated in composite materials, are expected to provide composite materials having increased fracture toughness, hardness, and wear resistance for such applications as cutting tools, wear parts, dies, turbines, nozzles, and the like.

The composition of the coated whiskers of the present invention can be selected to present an optimum combination of whisker characteristics and whisker surface characteristics tailored to the composite material in which they are to be used. For example, a whisker having characteristics most desirable for a particular composite, may be undesirably reactive with the matrix material of the composite. A coating of a material non-reactive with the matrix may be applied to the whisker to prevent bonding of the whisker surface to the matrix material, preserving the "whisker pullout" mechanism, i.e. decohesion and pullout of the whisker from the matrix, of a non-reactive whisker. Thus additional toughening of the composite material may be accomplished.

While there has been shown and described what are at present considered the preferred embodiments of the invention, it will be obvious to those skilled in the art that various changes and modifications can be made therein without departing from the scope of the invention as defined by the appended claims.

What is claimed is:

1. A process for producing coated metal carbide, nitride, or carbonitride whiskers comprising the step of flowing past whiskers comprising single crystals of a carbide, nitride, or carbonitride of Ti, Zr, Hf, V, Nb, Ta, and W, having an aspect ratio of length to diameter of about 5:1 to 500:1, and a diameter of about 0.5-10 microns, in a reaction chamber sealed from the ambient atmosphere and essentially free from undesired contaminants, and heated to an operating temperature of about 1025°-1125° C., a gaseous reactant mixture comprising hydrogen and the gases of Group I or Group II or mixture thereof; wherein Group I comprises a mixture of one or more metal halide gases selected from the group consisting of halides of Ti, Zr, Hf, Nb, Ta, and W, and one or more gases selected from the group consisting of nitrogen, ammonia, and aliphatic hydrocarbon pyrolyzable at the operating temperature to form free carbon, in an atomic ratio of carbon plus nitrogen to metal of about 5:1 to 16:1 and a volume ratio of hydrocarbon, plus nitrogen plus ammonia to hydrogen of about 1:5 to 1:20; and Group II comprises a mixture of one or more gases selected from the halides of Al, Zr, and Hf, and one or more gases selected from the group consisting of oxygen donor gases reacting with the Al, Zr, and Hf halides at the operating temperature to form one or more oxides of Al, Zr, and Hf, in proportions selected to react to form the oxides;

the flowing mixture of reactant gases being maintained at a suitable linear velocity for a time sufficient to deposit an adherent coating of a thickness between a monomolecular layer and about one-half the diameter of the whisker, on the whisker surfaces of one or more layers of a refractory material selected from the group consisting of carbides, nitrides, and carbonitrides of Ti, Zr, Hf, Nb, Ta, and W, and oxides of Al, Zr, and Hf, or a mixture or solid solution thereof, wherein the material of each layer is different from the material on which it is deposited.

2. A process according to claim 1 wherein two or more successive layers of the refractory materials are deposited on the whisker, and the total thickness of the coating being less than about one-half the diameter of the whisker, by repeating the process according to claim 1 for each layer deposited, and selecting different reactant mixtures for successive repetitions.

3. A process according to claim 1 further comprising the step, preceding the coating step, of producing the metal carbide, nitride, or carbonitride whiskers to be coated, by:

flushing the sealed reaction chamber with flowing hydrogen gas, wherein the reaction chamber includes one or more substrate surfaces formed from one or more substrate materials' suitable for providing catalyzing and supporting substrates for nucleation and growth of the whiskers, and wherein the substrate surfaces are maintained at the operating temperature of about 1025°-1125° C.; and mixing with the hydrogen flowing through the reaction chamber, at about ambient pressure, reactants comprising one or more metal halide gases selected from the group consisting of halides of Ti, Zr, Hr, V, Nb, Ta, and W, and one or more gases selected from the group consisting of nitrogen, ammonia, and aliphatic hydrocarbon gases pyrolyzable at the operating temperature to form free carbon, in an atomic ratio of carbon plus nitrogen to metal of about 5:1 to 16:1 and a volume ratio of hydrocarbon, plus nitrogen, plus ammonia to hydrogen of about 1:5 to 1:20, the flowing mixture of gases being maintained at a suitabe linear velocity for a time sufficient to nucleate and grow the metal carbide, nitride or carbonitride whiskers on the substrate material surfaces.

4. A process according to claim 2 further comprising the step, preceding the coating step, of producing the metal carbide, nitride, or carbonitride whiskers to be coated, by:

flushing the sealed reaction chamber with flowing hydrogen gas, wherein the reaction chamber includes one or more substrate surfaces formed from one or more substrate materials suitable for providing catalyzing and supporting substrates for nucleation and growth of the whiskers, and wherein the substrate surfaces are maintained at the operating temperature of about 1025°-1125° C.; and mixing with the hydrogen flowing through the reaction chamber, at about ambient pressure, reactants comprising one or more metal halide gases selected from the group consisting of halides of Ti, Zr, Hr, V, Nb, Ta, and W, and one or more gases selected from the group consisting of nitrogen, ammonia, and aliphatic hydrocarbon gases pyrolyzable at the operating temperature to form free carbon, in an atomic ratio of carbon plus nitrogen to metal of about 5:1 to 16:1 and a volume ratio of hydrocarbon, plus nitrogen, plus ammonia to hydrogen of about 1:5 to 1:20, the flowing mixture of gases being maintained at a suitable linear velocity for a time sufficient to nucleate and grow the metal carbide, nitride or carbonitride whiskers on the substrate material surfaces.

5. A process according to claim 1 further comprising the step, preceding the coating step, of producing the metal carbide, nitride, or carbonitride whiskers to be coated, by:

flushing the reaction chamber sealed from the ambient atmospheres with flowing hydrogen gas, wherein the reaction chamber is defined by surfaces of which at least a major portion of the surface area is formed from one or more substrate materials suitable for providing catalyzing and supporting substrates for nucleation and growth of the whiskers, and wherein the substrate material surfaces are maintained at the operating temperature of about 1025°-1125° C.; and mixing with the hydrogen flowing through the reaction chamber, at about ambient pressure, reactants comprising one or more metal halide gases selected from the group consisting of halides of Ti, Zr, Hf, V, Nb, Ta, and W, and one or more gases selected from the group consisting of nitrogen, ammonia, and aliphatic hydrocarbon gases pyrolyzable at the operating temperature to form free carbon, in an atomic ratio of carbon plus nitrogen to metal of about 5:1 to 16:1 and a volume ratio of hydrocarbon, plus nitrogen, plus ammonia to hydrogen of about 1:5 to 1:20, the flowing mixture of gases being maintained at a suitable linear velocity for a time sufficient to nucleate and grow the metal carbide, nitride, or carbonitride whiskers on the substrate material surfaces.

6. A process according to claim 2 further comprising the step, preceding the coating step, of producing the metal carbide, nitride, or carbonitride whiskers to be coated, by:

flushing the reaction chamber sealed from the ambient atmosphere with flowing hydrogen gas, wherein the reaction chamber is defined by surfaces of which at least a major portion of the surface area is formed from one or more substrate materials suitable for providing catalyzing and supporting substrates for nucleation and growth of the whiskers, and wherein the substrate material surfaces are maintained at the operating temperature of about 1025°–1125° C.; and mixing with the hydrogen flowing through the reaction chamber, at about ambient pressure, reactants comprising one or more metal halide gases selected from the group consisting of halides of Ti, Zr, Hf, V, Nb, Ta, and W, and one or more gases selected from the group consisting of nitrogen, ammonia, and aliphatic hydrocarbon gases pyrolyzable at the operating temperature to form free carbon, in an atomic ratio of carbon plus nitrogen to metal of about 5:1 to 16:1 and a volume ratio of hydrocarbon, plus nitrogen, plus ammonia to hydrogen of about 1:5 to 1:20, the flowing mixture of gases being maintained at a suitable linear velocity for a time sufficient to nucleate and grow the metal carbide, nitride, or carbonitride whiskers on the substrate material surfaces.

\* \* \* \* \*